United States Patent
Matsudo (10) Patent No.: US 12,387,908 B2
(45) Date of Patent: Aug. 12, 2025

(54) PLASMA TREATMENT APPARATUS

(71) Applicant: TOKYO ELECTRON LIMITED, Tokyo (JP)

(72) Inventor: Tatsuo Matsudo, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 112 days.

(21) Appl. No.: 18/036,106

(22) PCT Filed: Nov. 8, 2021

(86) PCT No.: PCT/JP2021/041007
§ 371 (c)(1),
(2) Date: May 9, 2023

(87) PCT Pub. No.: WO2022/107631
PCT Pub. Date: May 27, 2022

(65) Prior Publication Data
US 2023/0411118 A1     Dec. 21, 2023

(30) Foreign Application Priority Data
Nov. 18, 2020     (JP) ................ 2020-191877

(51) Int. Cl.
*H01J 37/32*     (2006.01)
(52) U.S. Cl.
CPC .. *H01J 37/32174* (2013.01); *H01J 37/32449* (2013.01); *H01J 37/32568* (2013.01); *H01J 37/32816* (2013.01); *H01J 2237/332* (2013.01)
(58) Field of Classification Search
None
See application file for complete search history.

(56) References Cited

U.S. PATENT DOCUMENTS

| | | | |
|---|---|---|---|
| 2002/0038631 A1 | 4/2002 | Sumiya et al. | |
| 2002/0179245 A1* | 12/2002 | Masuda | H01J 37/32458 156/345.1 |
| 2005/0121305 A1* | 6/2005 | Saeki | H01J 37/3266 422/186 |
| 2010/0310791 A1* | 12/2010 | Shimazu | H01J 37/32706 118/723 R |

FOREIGN PATENT DOCUMENTS

| | | |
|---|---|---|
| JP | 2004-183071 A | 7/2004 |
| KR | 10-2001-0112324 A | 12/2001 |
| KR | 10-2010-0098575 A | 9/2010 |

OTHER PUBLICATIONS

PCT International Search Report and Written Opinion, PCT Application No. PCT/JP2021/041007, Jan. 25, 2022, 8 pages (with English translation of PCT International Search Report).

* cited by examiner

*Primary Examiner* — Kenneth B Wells
(74) *Attorney, Agent, or Firm* — Fenwick & West LLP (57) ABSTRACT

There is provided a plasma processing apparatus comprising: a chamber; a gas supply configured to supply gas into the chamber; a substrate support provided in the chamber; a ground electrode electrically grounded and provided in the chamber; an upper electrode provided above the substrate support and the ground electrode; a first high-frequency power supply electrically connected to the upper electrode to generate a plasma from the gas in the chamber; a second high-frequency power supply electrically connected to the upper electrode; and a rectifier configured to block application of a negative voltage to the upper electrode by the second high-frequency power supply.

7 Claims, 6 Drawing Sheets

PLASMA TREATMENT APPARATUS

TECHNICAL FIELD

Exemplary embodiments of the present disclosure relate to a plasma processing apparatus.

BACKGROUND

A capacitively coupled plasma processing apparatus is used for plasma processing such as film formation processing. The capacitively coupled plasma processing apparatus includes a chamber, a substrate support, an upper electrode, a gas supply, and an exhaust device. The substrate support includes a lower electrode and is provided in the chamber. The upper electrode is provided above the lower electrode. The gas supply and the exhaust device are connected to the chamber. Patent Document 1 below discloses such a plasma processing apparatus.

The plasma processing apparatus disclosed in Patent Document 1 further includes a first high-frequency power supply and a second high-frequency power supply. The first high-frequency power supply supplies a high-frequency power to the upper electrode to generate plasma in the chamber. The second high-frequency power supply applies a high-frequency bias to the upper electrode to control the energy of ions colliding with a substrate on the substrate support from the plasma.

PRIOR ART DOCUMENTS

Patent Documents

Patent Document 1: Japanese Laid-open Patent Publication No. 2004-183071

SUMMARY

Problems to Be Resolved by the Invention

The present disclosure provides a technique for controlling the energy of ions colliding with a substrate while suppressing the effect on plasma density in a chamber of a plasma processing apparatus.

Means for Solving the Problems

In one exemplary embodiment, a plasma processing apparatus is provided. The plasma processing apparatus includes a chamber, a gas supply, a substrate support, a ground electrode, an upper electrode, a first high-frequency power supply, a second high-frequency power supply, and a rectifier. The gas supply is configured to supply gas into the chamber. The substrate support is provided in the chamber. The ground electrode is electrically grounded and provided in the chamber. The upper electrode is provided above the substrate support and the ground electrode. The first high-frequency power supply is electrically connected to the upper electrode to generate a plasma from the gas in the chamber. The second high-frequency power supply is electrically connected to the upper electrode. The rectifier is configured to block application of a negative voltage to the upper electrode by the second high-frequency power supply.

Effect of the Invention

According to one exemplary embodiment, it is possible to control the energy of ions colliding with a substrate while suppressing the effect on plasma density in a chamber of a plasma processing apparatus.

DETAILED DESCRIPTION

Various exemplary embodiments are described below.

In one exemplary embodiment, a plasma processing apparatus is provided. The plasma processing apparatus includes a chamber, a gas supply, a substrate support, a ground electrode, an upper electrode, a first high-frequency power supply, a second high-frequency power supply, and a rectifier. The gas supply is configured to supply gas into the chamber. The substrate support is provided in the chamber. The ground electrode is electrically grounded and provided in the chamber. The upper electrode is provided above the substrate support and the ground electrode. The first high-frequency power supply is electrically connected to the upper electrode to generate a plasma from the gas in the chamber. The second high-frequency power supply is electrically connected to the upper electrode. The rectifier is configured to block application of a negative voltage to the upper electrode by the second high-frequency power supply.

In the plasma processing apparatus of the above embodiment, the plasma is generated in the chamber by supplying high-frequency power from the first high-frequency power supply to the upper electrode. The energy of ions colliding with a substrate on the substrate support from the plasma is controlled by a high-frequency voltage applied from the second high-frequency power supply to the upper electrode. The negative voltage of the high-frequency voltage from the second high-frequency power supply can affect plasma density in the chamber, but the negative voltage is blocked by the rectifier. Therefore, according to the plasma processing apparatus of the above embodiment, it is possible to control the energy of ions colliding with the substrate while suppressing the effect on the plasma density by the high-frequency voltage applied from the second high-frequency power supply to the upper electrode.

In one exemplary embodiment, the plasma processing apparatus may further include a pressure controller. The pressure controller is configured to control a pressure of gas in the chamber. The pressure controller is configured to set the pressure of gas in the chamber to 13.3 Pa (100 mTorr) or higher when plasma is generated in the chamber.

In one exemplary embodiment, the rectifier may include a diode. A cathode of the diode is connected to a feed line connected between the second high-frequency power supply and the upper electrode. An anode of the diode is connected to ground.

In one exemplary embodiment, the plasma processing apparatus may further include another rectifier configured to block application of a positive voltage to the upper electrode by the first high-frequency power supply.

In one exemplary embodiment, said another rectifier may include a diode. An anode of the diode of said another rectifier is connected to a feed line connected between the first high-frequency power supply and the upper electrode. A cathode of said another rectifier is connected to ground.

In one exemplary embodiment, the substrate support may include a lower electrode which is the ground electrode.

In one exemplary embodiment, the substrate support may include a lower electrode. The plasma processing apparatus may further include an impedance circuit connected between the lower electrode and ground. The ground electrode may be provided around the substrate support.

In one exemplary embodiment, a frequency of the high-frequency voltage output from the second high-frequency power supply may be 100 kHz or higher, 450 kHz or higher, or 2 MHz or higher. The frequency of the high-frequency voltage output from the second high-frequency power supply may be lower than, higher than, or equal to a frequency of the high-frequency power output from the first high-frequency power supply.

Various exemplary embodiments are described in detail below with reference to the accompanying drawings. The same reference numerals are given to parts which are the same or equivalent in each drawing.

Figure 1:
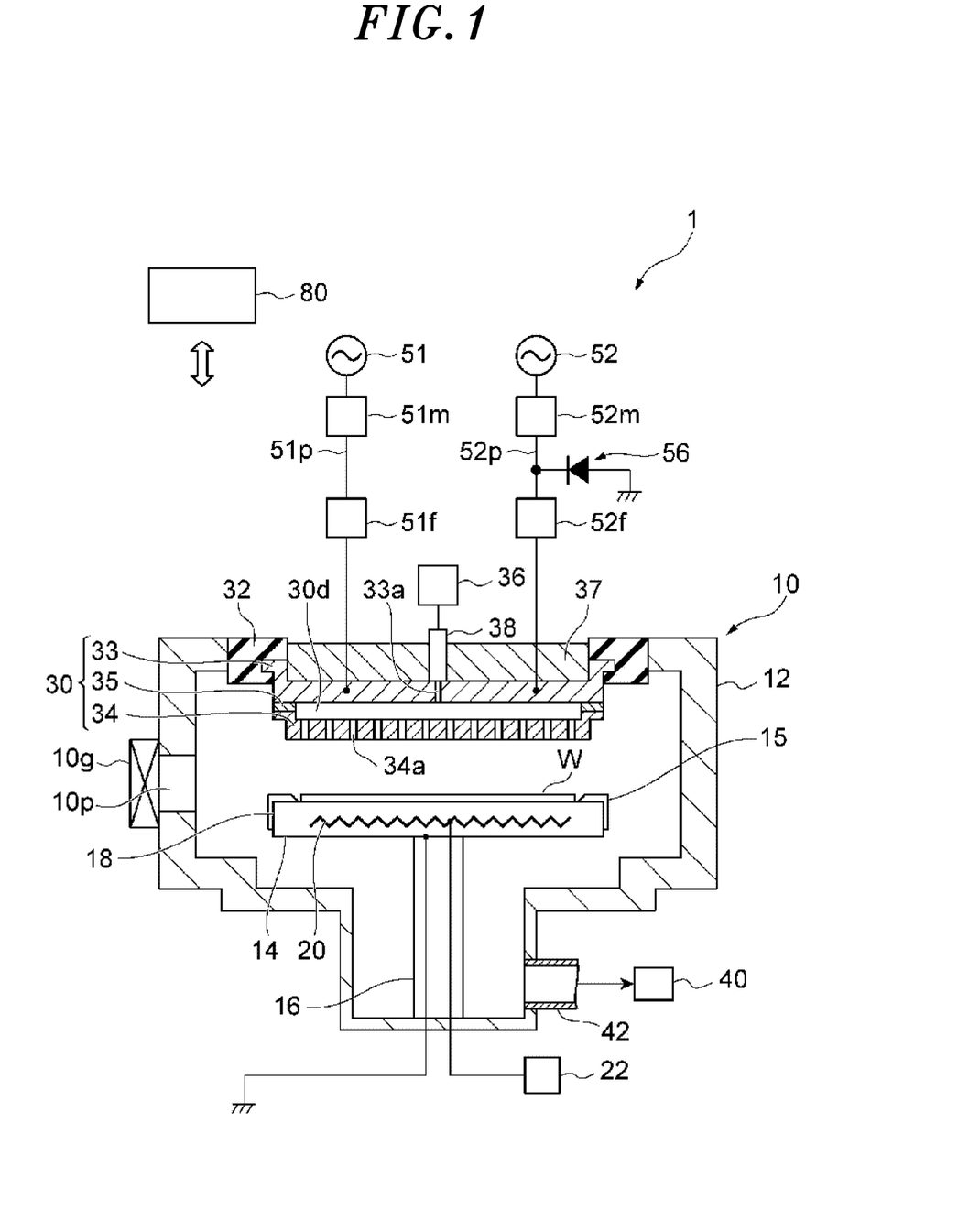
FIG. 1 is a diagram schematically showing a plasma processing apparatus according to one exemplary embodiment.

FIG. 1 is a diagram schematically showing a plasma processing apparatus according to one exemplary embodiment. The plasma processing apparatus shown in FIG. 1 includes a chamber 10. The chamber 10 provides an interior space therein. The chamber 10 may include a chamber body 12. The chamber body 12 is substantially cylindrical in shape. Walls, including a side wall, of the chamber 10 are provided by the chamber body 12. The interior space of the chamber 10 is provided in the chamber body 12. The chamber body 12 is made of metal such as aluminum. The chamber body 12 may be electrically grounded.

The chamber 10 provides a passage 10p in its side wall. A substrate W processed in the plasma processing apparatus 1 passes through the passage 10p when it is transferred between the inside and the outside of the chamber 10. A gate valve 10g is provided along the side wall of the chamber 10 for opening and closing the passage 10p.

The plasma processing apparatus 1 further includes a substrate support 14. The substrate support 14 is provided in the chamber 10. The substrate support 14 is configured to support the substrate W placed thereon. The substrate support 14 is made of metal, such as nickel, and is used as a lower electrode 18. The substrate support 14 may have a disk shape. A guide ring 15 may be provided on an outer edge of the substrate support 14. The substrate support 14 may be supported by a support member 16. The support member 16 extends upwardly from a bottom of the chamber 10. The support member 16 may have a cylindrical shape.

In the embodiment shown in FIG. 1, the substrate support 14, i.e., the lower electrode 18, is connected to ground and is grounded. In other words, in one embodiment, the lower electrode 18 is a ground electrode provided in the chamber 10. The substrate support 14 may include a heater 20. The heater 20 is embedded in the substrate support 14. The heater 20 is a resistive heating element and is made of a refractory metal such as molybdenum. The heater 20 is connected to a heater power supply 22. The heater power supply 22 is provided outside the chamber 10. The heater 20 heats the substrate W by receiving power from the heater power supply 22 and generating heat.

The plasma processing apparatus 1 further includes an upper electrode 30. The upper electrode 30 is provided above the substrate support 14. The upper electrode 30 forms a ceiling of the chamber 10. The upper electrode 30 is electrically isolated from the chamber body 12. In one embodiment, the upper electrode 30 is fixed to an upper portion of the chamber body 12 via an insulating member 32.

In one embodiment, the upper electrode 30 is configured as a showerhead. The upper electrode 30 may include a base member 33 and a top plate 34. The upper electrode 30 may further include an intermediate member 35. The base member 33, the top plate 34, and the intermediate member 35 are conductive and made of, for example, aluminum. The base member 33 is provided above the top plate 34. A heat insulating member 37 may be provided on the base member 33. The intermediate member 35 has a substantially annular shape and is sandwiched between the base member 33 and the top plate 34. The base member 33 and the top plate 34 provide a gas diffusion space 30d therebetween. The base member 33 provides a gas introduction port 33a connected to the gas diffusion space 30d. The top plate 34 has a plurality of gas holes 34a. The plurality of gas holes 34a extend downward from the gas diffusion space 30d and penetrate the top plate 34 along the thickness direction thereof.

The plasma processing apparatus 1 further includes a gas supply 36. The gas supply 36 is configured to supply gas into the chamber 10. In one embodiment, the gas supply 36 is connected to the gas introduction port 33a via a pipe 38. The gas supply 36 may have one or more gas sources, one or more flow controllers, and one or more on-off valves. Each of the one or more gas sources is connected to the gas introduction port 33a via a corresponding flow controller and a corresponding on-off valve.

In one embodiment, the gas supply 36 may supply a film forming gas. In other words, the plasma processing apparatus 1 may be a film forming apparatus. The film formed on the substrate W by using the film forming gas may be an insulating film or a dielectric film. In another embodiment, the gas supply 36 may supply an etching gas. In other words, the plasma processing apparatus 1 may be a plasma etching apparatus.

The plasma processing apparatus 1 further includes an exhaust device 40. The exhaust device 40 includes a pressure controller such as an automatic pressure control valve, i.e., a pressure controller in one embodiment, and a vacuum pump such as a turbomolecular pump or a dry pump. In one embodiment, the pressure controller of the exhaust device 40 may set a pressure of gas in the chamber 10 to a pressure of 100 mTorr (13.3 Pa) or higher during plasma generation in the chamber 10. The pressure of gas in the chamber 10 may be set to a pressure of 1 Torr (133 Pa) or higher. The exhaust device 40 is connected to an exhaust pipe 42. The exhaust pipe 42 is connected to the bottom of the chamber 10 and communicates with the interior space of the chamber 10. The exhaust pipe 42 may be connected to the side wall of the chamber 10.

The plasma processing apparatus 1 further includes a first high-frequency power supply 51. The first high-frequency power supply 51 generates first high-frequency power for plasma generation. The first high-frequency power supply 51 is connected to the upper electrode 30 by a feed line 51p. The feed line 51p is provided in part by a matching box 51m and a filter 51f. In other words, the first high-frequency power supply 51 is connected to the upper electrode 30 via the matching box 51m and the filter 51f. The matching box 51m has a matching circuit for matching an impedance of a load of the first high-frequency power supply 51 with an output impedance of the first high-frequency power supply 51. The filter 51f is an electric filter for cutting off or attenuating second high-frequency power, which will be described later.

Figure 2A:
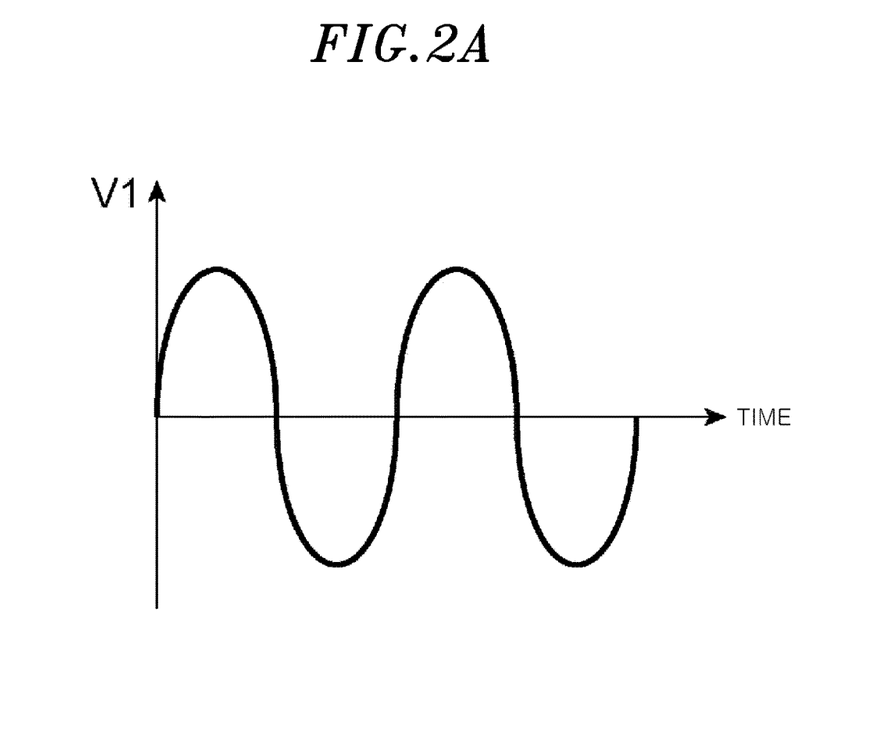
FIG. 2A is a diagram showing an example of a waveform of a first high-frequency voltage applied to an upper electrode.

The first high-frequency power supply 51 supplies the first high-frequency power to the upper electrode 30 and applies a first high-frequency voltage (see voltage V1 in FIG. 2A) to the upper electrode 30 to generate a plasma from gas in the chamber 10. A first frequency, which is a frequency of the first high-frequency power and the first high-frequency voltage, may be less than 13.56 MHz. The first frequency may be 2 MHz or less. The first frequency may be 200 kHz or higher.

The plasma processing apparatus 1 further includes a second high-frequency power supply 52. The second high-frequency power supply 52 generates a second high-frequency power for biasing. The second high-frequency power supply 52 is connected to the upper electrode 30 by a feed line 52p. The feed line 52p is provided in part by a matching box 52m and a filter 52f. In other words, the second high-frequency power supply 52 is connected to the upper electrode 30 via the matching box 52m and the filter 52f. The matching box 52m has a matching circuit for matching an impedance of a load of the second high-frequency power supply 52 with an output impedance of the second high-frequency power supply 52. The filter 52f is an electric filter for cutting off or attenuating the first high-frequency power.

The second high-frequency power supply 52 supplies the second high-frequency power to the upper electrode 30 and applies a second high-frequency voltage to the upper electrode to control the energy of ions colliding with the substrate W from the plasma in the chamber A second frequency, which is a frequency of the second high-frequency power and the second high-frequency voltage, may be different from the first frequency or the same as the first frequency. The frequency of the second high-frequency voltage may be lower than the first frequency or higher than the first frequency. The second frequency may be a frequency of 100 kHz or higher. The second frequency may be a frequency of 450 kHz or higher or a frequency of 2 MHz or higher.

Figure 2B:
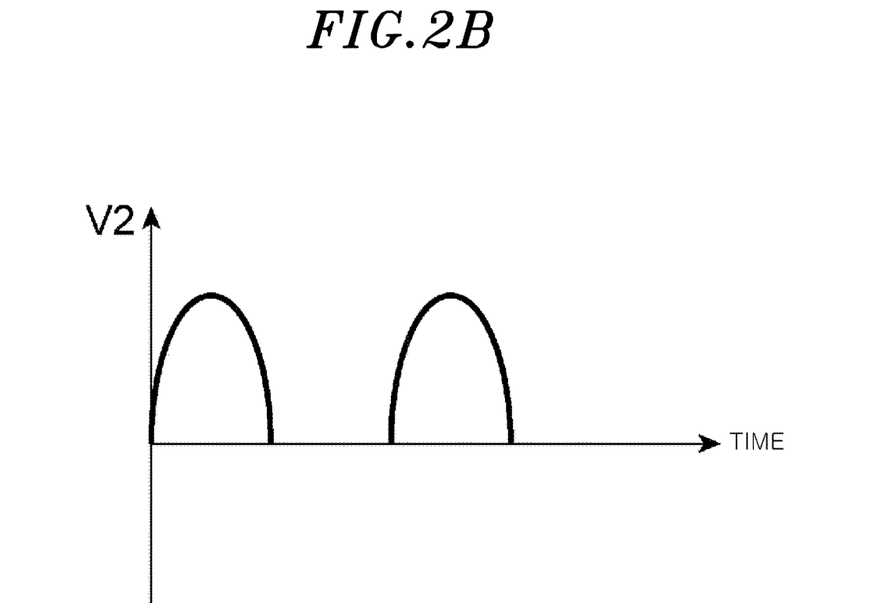
FIG. 2B is a diagram showing an example of a waveform of a second high-frequency voltage applied to the upper electrode.

The plasma processing apparatus 1 further includes a rectifier 56. The rectifier 56 is configured to block application of a negative voltage to the upper electrode 30 by the second high-frequency power supply 52. In other words, the rectifier 56 shapes the waveform of the second high-frequency voltage applied from the second high-frequency power supply 52 to the upper electrode 30 to block the negative voltage of the second high-frequency voltage (see voltage V2 in FIG. 2B). In one embodiment, the rectifier 56 includes a diode as shown in FIG. 1. A cathode of the diode of the rectifier 56 is connected to the feed line 52p. The cathode of the diode of the rectifier 56 may be connected to the feed line 52p between the matching box 52m and the filter 52f. An anode of the diode of the rectifier 56 is connected to ground.

The plasma processing apparatus 1 may further include a controller 80. The controller is configured to control each component of the plasma processing apparatus 1. The controller 80 may be a computer having a processor, a storage unit such as a memory, an input device, a display device, a signal input/output interface, and the like. The storage unit of the controller 80 stores a control program and recipe data. The processor of the controller 80 executes the control program and controls each component of the plasma processing apparatus 1 according to the recipe data.

The controller 80 controls the gas supply 36 and the exhaust device 40 so that a pressure of gas in the chamber 10 becomes 100 mTorr (13.3 Pa) or more or 1 Torr (133 Pa) or more when the plasma is generated in the chamber 10. The controller 80 controls the first high-frequency power supply 51 to supply the first high-frequency power to the upper electrode 30. The controller 80 controls the second high-frequency power supply 52 to supply the second high-frequency power to the upper electrode 30.

An experiment conducted with the plasma processing apparatus 1 is described herein. In the experiment, plasma was generated from a mixed gas of argon gas and oxygen gas in the chamber 10 by supplying only the first high-frequency power to the upper electrode 30. The power level of the first high-frequency power was 500 W. In the experiment, the electron density in the plasma in the chamber 10 was measured using a plasma absorption probe while varying the frequency of the first high-frequency power and the pressure of the gas in the chamber 10. Four frequencies of 450 kHz, 2 MHz, 13.56 MHz, and 40.68 MHz were used as the frequencies of the first high-frequency power.

Figure 3:
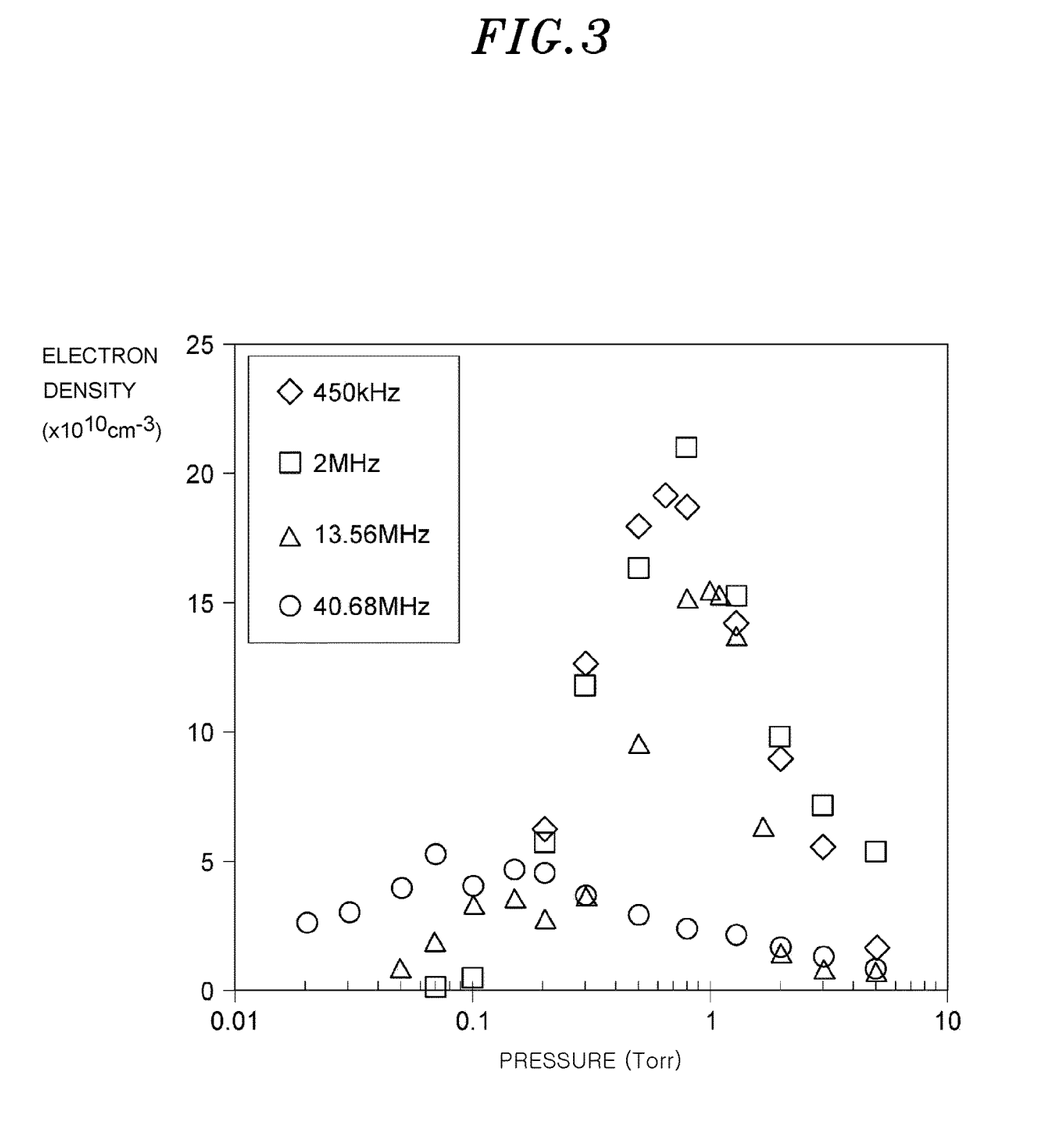
FIG. 3 is a graph showing an experimental result.

FIG. 3 shows the result of the experiment. In the graph of FIG. 3, the horizontal axis indicates the pressure of gas in the chamber 10 in the experiment, and the vertical axis indicates the electron density of the plasma. As shown in FIG. 3, when the pressure of gas in the chamber 10 was set to a high pressure of 100 mTorr (13.3 Pa) or higher, the electron density was increased even with a high-frequency power having a frequency lower than 13.56 MHz. From the result of the experiment, it was confirmed that even if the frequency of the second high-frequency power is low, the plasma density is affected by the second high-frequency power if the waveform of the second high-frequency voltage is not shaped.

In the plasma processing apparatus 1, plasma is generated in the chamber 10 by supplying the first high-frequency power from the first high-frequency power supply 51 to the upper electrode 30. The energy of ions from the plasma, that collide with the substrate W on the substrate support 14, is controlled by the second high-frequency voltage applied from the second high-frequency power supply 52 to the upper electrode 30. The negative voltage of the second high-frequency voltage from the second high-frequency power supply 52 can affect the plasma density in the chamber 10, but the negative voltage is blocked by the rectifier 56. Therefore, according to the plasma processing apparatus 1, it is possible to control the energy of ions colliding with the substrate W while suppressing the effect of the second high-frequency voltage from the second high-frequency power supply 52 on the plasma density. Therefore, according to the plasma processing apparatus 1, the independence of plasma density control by the first high-frequency voltage from the first high-frequency power supply 51 is improved.

Figure 4:
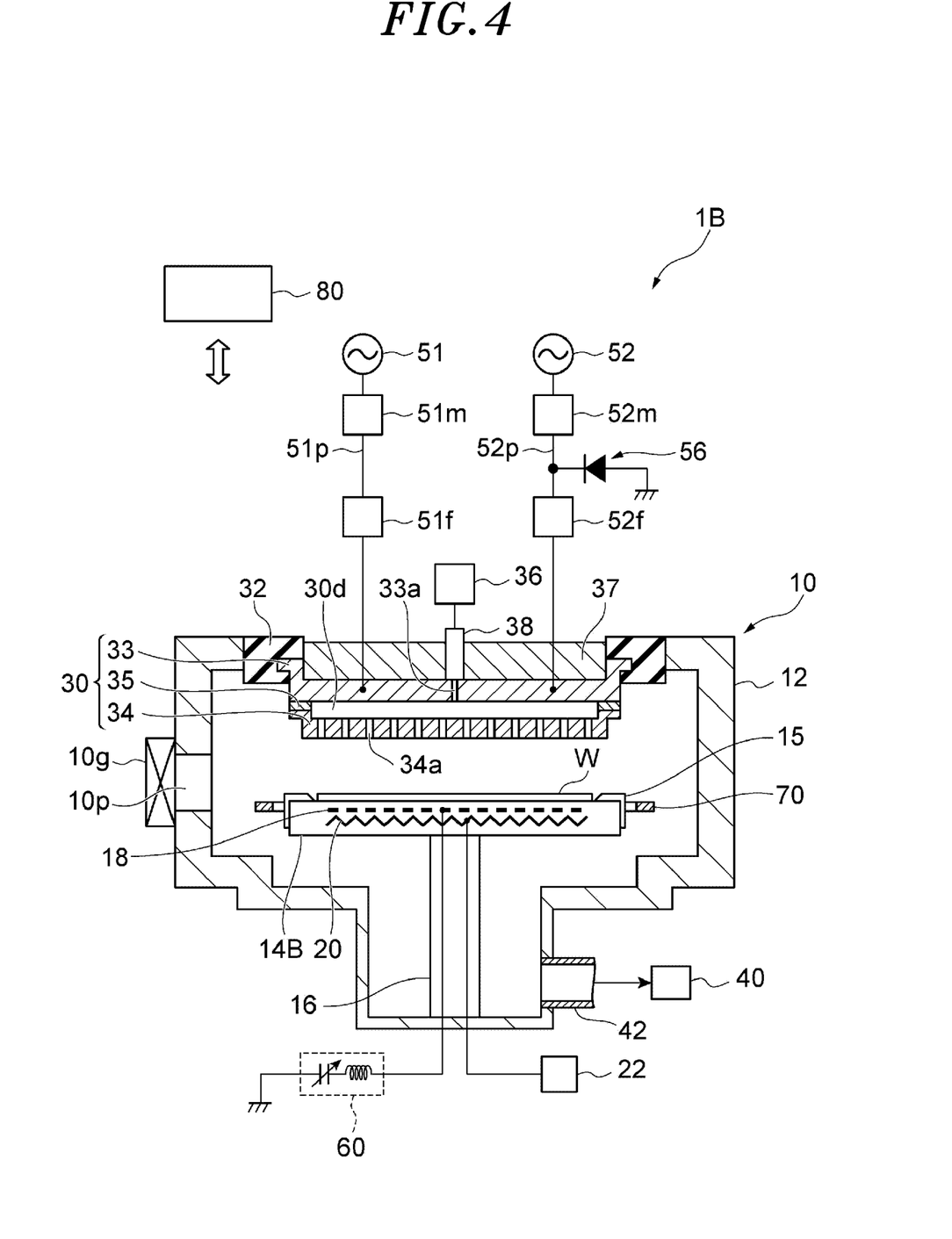
FIG. 4 is a diagram schematically showing a plasma processing apparatus according to another exemplary embodiment.

Next, a plasma processing apparatus according to another exemplary embodiment will be described with reference to FIG. 4. FIG. 4 is a diagram schematically showing a plasma processing apparatus according to another exemplary embodiment. A plasma processing apparatus 1B shown in FIG. 4 differs from the plasma processing apparatus 1 in that it further includes an impedance circuit 60 and a ground electrode 70. Further, the plasma processing apparatus 1B includes a substrate support 14B instead of the substrate support 14.

The substrate support 14B is provided in the chamber 10. The substrate support 14B is configured to support the substrate W placed thereon. The substrate support 14B has a main body. The main body of the substrate support 14B is made of aluminum nitride, for example, and may have a disk shape. The guide ring 15 may be provided on an outer edge of the main body of the substrate support 14B. The substrate support 14B may be supported by the support member 16, similarly to the substrate support 14. The substrate support 14B includes the lower electrode 18. The lower electrode 18 is embedded in the main body of the substrate support 14B.

The impedance circuit 60 is connected between the lower electrode 18 and ground. The impedance circuit 60 may provide a variable impedance at the first frequency between the lower electrode 18 and ground. The impedance circuit 60 may include a series circuit of an inductor and a capacitor. The inductor may be a variable inductor and the capacitor may be a variable capacitor. The impedance circuit 60 adjusts a degree of electrical coupling between the upper electrode 30 and the lower electrode 18. Therefore, according to the impedance circuit 60, the current flowing through the lower electrode 18 is adjusted and the energy given to the substrate W on the substrate support 14 is adjusted.

Since the impedance circuit 60 is connected between the lower electrode 18 and ground in the plasma processing apparatus 1B, a potential of the lower electrode 18 does not become a ground potential. The ground electrode 70 is grounded via wiring (not shown) or the like, and is provided in the chamber 10 to provide a reference ground potential in the chamber 10. The ground electrode 70 is provided so that the upper electrode 30 is positioned above it. In one embodiment, the ground electrode 70 extends circumferentially around the substrate support 14. The ground electrode 70 may have an annular shape.

Figure 5:
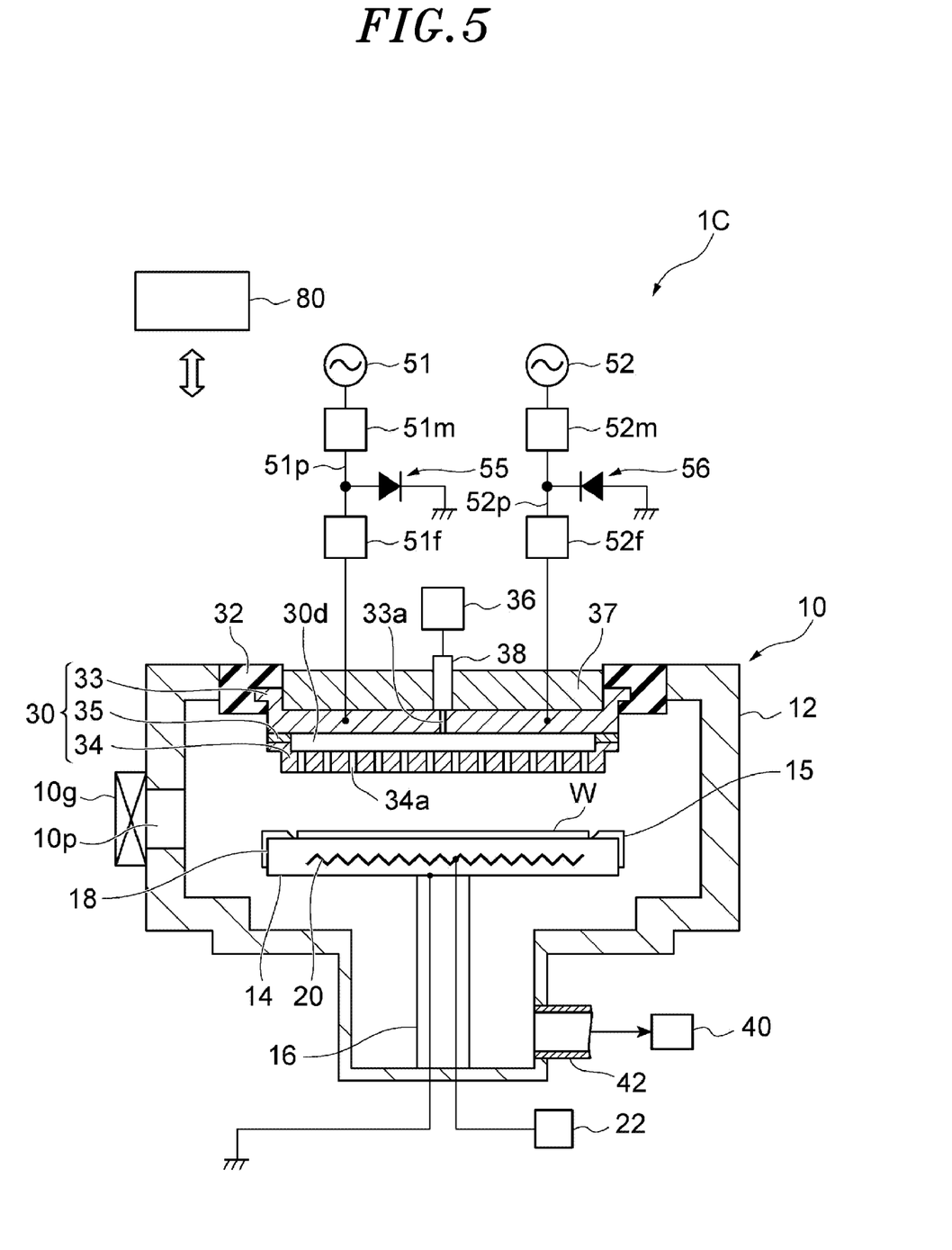
FIG. 5 is a diagram schematically showing a plasma processing apparatus according to yet another exemplary embodiment.

Next, a plasma processing apparatus according to yet another exemplary embodiment will be described with reference to FIG. 5. FIG. 5 is a diagram schematically showing a plasma processing apparatus according to yet another exemplary embodiment. A plasma processing apparatus 1C shown in FIG. 5 differs from the plasma processing apparatus 1 in that a rectifier 55 is further provided.

Figure 6:
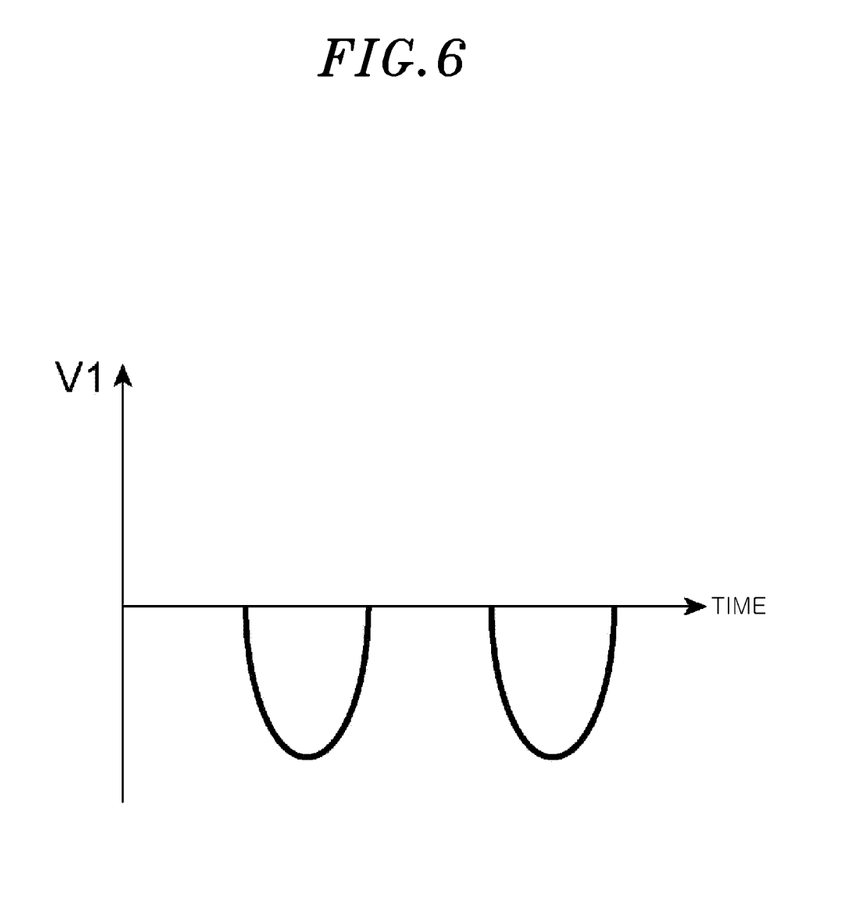
FIG. 6 is a diagram showing an example of the waveform of the first high-frequency voltage applied to the upper electrode.

The rectifier 55 is configured to block application of a positive voltage to the upper electrode 30 by the first high-frequency power supply 51. In other words, the rectifier 55 shapes the waveform of the first high-frequency voltage applied from the first high-frequency power supply 51 to the upper electrode 30 to block the positive voltage of the first high-frequency voltage (see voltage V1 in FIG. 6). In one embodiment, the rectifier 55 includes a diode as shown in FIG. 5. An anode of the diode of the rectifier 55 is connected to the feed line 51p. The anode of the diode of the rectifier 55 may be connected to the feed line 51p between the matching box 51m and the filter 51f. A cathode of the diode of the rectifier 55 is connected to ground.

In the plasma processing apparatus 1C, when a negative voltage is applied from the first high-frequency power supply 51 to the upper electrode 30, positive ions from the plasma collide with the upper electrode 30, and secondary electrons are emitted from the upper electrode 30. The plasma density in the chamber 10 is determined by the secondary electrons emitted from the upper electrode 30. Therefore, in the plasma processing apparatus 1C, the rectifier 55 shapes the waveform of the first high-frequency voltage so that only the negative voltage is applied from the first high-frequency power supply 51 to the upper electrode 30. Further, in the plasma processing apparatus 1C, only a negative voltage is applied from the first high-frequency power supply 51 to the upper electrode 30, and only a positive voltage is applied from the second high-frequency power supply 52 to the upper electrode 30. Therefore, according to the plasma processing apparatus 1C, the independence of the control of the plasma density and the control of the energy of ions colliding with the substrate W is improved.

While various exemplary embodiments have been described above, various additions, omissions, substitutions, and modifications may be made without being limited to the exemplary embodiments described above. Further, elements from different embodiments can be combined to form other embodiments.

From the above description, it will be appreciated that various embodiments of the present disclosure have been described herein for purposes of illustration, and that various changes can be made without departing from the scope and spirit of the present disclosure. Therefore, the various embodiments disclosed herein are not intended to be limiting, with a true scope and spirit being indicated by the appended claims.

DESCRIPTION OF REFERENCE NUMERALS

1: plasma processing apparatus, 10: chamber, 14: substrate support, 18: lower electrode, 30: upper electrode, 36: gas supply, 51: first high-frequency power supply, 52: second high-frequency power supply, 56: rectifier

The invention claimed is:
1. A plasma processing apparatus comprising:
a chamber;
a gas supply configured to supply gas into the chamber;
a substrate support provided in the chamber;
a ground electrode electrically grounded and provided in the chamber;
an upper electrode provided above the substrate support and the ground electrode;
a first high-frequency power supply electrically connected to the upper electrode, the first high-frequency power supply configured to generate a plasma from the gas in the chamber;
a second high-frequency power supply electrically connected to the upper electrode; and
a rectifier configured to block application of a negative voltage to the upper electrode by the second high-frequency power supply,
wherein the rectifier includes a diode, and
a cathode of the diode is connected to a feed line connected between the second high-frequency power supply and the upper electrode, and an anode of the diode is connected to ground.
2. The plasma processing apparatus of claim 1, further comprising:
a pressure controller configured to control a pressure of gas in the chamber, wherein the pressure controller is configured to set the pressure of gas in the chamber to 13.3 Pa or higher when plasma is generated in the chamber.

3. The plasma processing apparatus of claim 1, wherein the substrate support includes a lower electrode which is the ground electrode.

4. The plasma processing apparatus of claim 1, wherein a frequency of a high-frequency power output from the second high-frequency power supply is 100 kHz or higher.

5. A plasma processing apparatus comprising:
a chamber;
a gas supply configured to supply gas into the chamber;
a substrate support provided in the chamber;
a ground electrode electrically grounded and provided in the chamber;
an upper electrode provided above the substrate support and the ground electrode;
a first high-frequency power supply electrically connected to the upper electrode, the first high-frequency power supply configured to generate a plasma from the gas in the chamber;
a second high-frequency power supply electrically connected to the upper electrode;
a rectifier configured to block application of a negative voltage to the upper electrode by the second high-frequency power supply; and
another rectifier configured to block application of a positive voltage to the upper electrode by the first high-frequency power supply.

6. The plasma processing apparatus of claim 5, wherein said another rectifier includes a diode,
an anode of the diode of said another rectifier is connected to a feed line connected between the first high-frequency power supply and the upper electrode, and
a cathode of the diode of said another rectifier is connected to ground.

7. A plasma processing apparatus comprising:
a chamber;
a gas supply configured to supply gas into the chamber;
a substrate support provided in the chamber;
a ground electrode electrically grounded and provided in the chamber;
an upper electrode provided above the substrate support and the ground electrode;
a first high-frequency power supply electrically connected to the upper electrode, the first high-frequency power supply configured to generate a plasma from the gas in the chamber;
a second high-frequency power supply electrically connected to the upper electrode; and
a rectifier configured to block application of a negative voltage to the upper electrode by the second high-frequency power supply,
wherein the substrate support includes a lower electrode, and
the plasma processing apparatus further comprises an impedance circuit connected between the lower electrode and ground, and the ground electrode is provided around the substrate support.

* * * * *